United States Patent
Flaker et al.

(10) Patent No.: US 7,405,982 B1
(45) Date of Patent: Jul. 29, 2008

(54) METHODS TO IMPROVE THE OPERATION OF SOI DEVICES

(75) Inventors: Roy Childs Flaker, deceased, late of Essex Junction VT (US); by Catherine O'Brien, legal representative, Essex Junction, VT (US); by Scott Flaker, legal representative, Essex Junction, VT (US); by Shirley A. Flaker, legal representative, Essex Junction, VT (US); by Bruce Flaker, legal representative, Essex Junction, VT (US); by Anne Flaker, legal representative, Essex Junction, VT (US); by Heather Flaker, legal representative, Essex Junction, VT (US); Louis L. Hsu, Fishkill, NY (US); Jente B. Kuang, Paughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1655 days.

(21) Appl. No.: 09/588,351

(22) Filed: Jun. 7, 2000

Related U.S. Application Data

(63) Continuation of application No. 09/063,823, filed on Apr. 22, 1998, now Pat. No. 6,160,292.

(60) Provisional application No. 60/044,251, filed on Apr. 23, 1997.

(51) Int. Cl.
*G11C 5/14* (2006.01)

(52) U.S. Cl. .................... 365/189.09; 365/189.11; 257/353; 257/E27.112

(58) Field of Classification Search .......... 257/347–354
See application file for complete search history.

(56) References Cited

U.S. PATENT DOCUMENTS 3,916,169 A   10/1975   Cochran et al. ............. 235/156

3,990,056 A   11/1976   Luisi et al. .................. 340/173

(Continued)

OTHER PUBLICATIONS

E. Dubois, et al., Anomalous Voltage Overshoot During Turn-Off of Thin-Film n-Channel SOI MOSET's Lee Electron Device Letters, vol. 14, No. 4, Apr. 1993.

(Continued)

*Primary Examiner*—Jerome Jackson
*Assistant Examiner*—Paul A. Budd
(74) *Attorney, Agent, or Firm*—Connolly Bove Lodge and Hutz; Robert M. Trepp

(57) ABSTRACT

According to the present invention, a circuit and methods for enhancing the operation of SOI fabricated devices are disclosed. In a preferred embodiment of the present invention, a pulse discharge circuit is provided. Here, a circuit is designed to provide a pulse that will discharge the accumulated electrical charge on the body of the SOI devices in the memory subarray just prior to the first access cycle. As explained above, once the accumulated charge has been dissipated, the speed penalty for successive accesses to the memory subarray is eliminated or greatly reduced. With a proper control signal, timing and sizing, this can be a very effective method to solve the problem associated with the SOI loading effect. Alternatively, instead of connecting the bodies of all SOI devices in a memory circuit to ground, the bodies of the N-channel FET pull-down devices of the local word line drivers can be selectively connected to a reference ground. This would enable the circuit to retain most of the speed advantages associated with SOI devices while overcoming the loading problem described above. With this preferred embodiment of the present invention, the major delay caused by the bipolar loading effect is minimized while the speed advantage due to providing a lower, variable Vt effect is preserved. The overall body resistance of the individual devices has a minimal effect on the device body potential.

2 Claims, 6 Drawing Sheets

U.S. PATENT DOCUMENTS

| | | | |
|---|---|---|---|
| 4,006,458 A | 2/1977 | Booher | 340/147 R |
| 4,169,233 A | 9/1979 | Haraszti | 307/355 |
| 4,253,162 A | 2/1981 | Hollingsworth | 365/175 |
| 4,494,015 A | 1/1985 | Frieling et al. | 307/268 |
| 4,513,431 A | 4/1985 | Chamberlain et al. | 377/60 |
| 4,700,086 A | 10/1987 | Ling et al. | 307/443 |
| 4,907,053 A * | 3/1990 | Ohmi | 257/315 |
| 4,946,799 A * | 8/1990 | Blake et al. | 437/41 |
| 5,045,916 A | 9/1991 | Vor et al. | 357/71 |
| 5,113,236 A * | 5/1992 | Arnold et al. | 357/41 |
| 5,145,802 A | 9/1992 | Tyson et al. | 437/63 |
| 5,293,052 A | 3/1994 | Cherne et al. | 257/349 |
| 5,405,795 A | 4/1995 | Beyer et al. | 437/41 |
| 5,420,055 A | 5/1995 | Vu et al. | 437/40 |
| 5,426,605 A | 6/1995 | Berkel et al. | 365/182 |
| 5,448,513 A | 9/1995 | Hu et al. | 365/150 |
| 5,489,792 A | 2/1996 | Hu et al. | 257/347 |
| 5,498,882 A | 3/1996 | Houston | 257/57 |
| 5,521,414 A * | 5/1996 | Palara | 257/355 |
| 5,573,964 A | 11/1996 | Hsu et al. | 437/40 |
| 5,599,725 A | 2/1997 | Dorleans et al. | 437/40 |
| 5,622,881 A | 4/1997 | Acocella et al. | 438/264 |
| 5,633,522 A | 5/1997 | Dorleans et al. | 257/344 |
| 5,643,813 A | 7/1997 | Acocella et al. | 437/43 |
| 5,663,578 A | 9/1997 | Hsu et al. | 257/66 |
| 5,675,164 A | 10/1997 | Brunner et al. | 257/331 |
| 5,689,127 A | 11/1997 | Chu et al. | 257/329 |
| 5,729,039 A | 3/1998 | Beyer et al. | 257/347 |
| 5,736,891 A | 4/1998 | Buti et al. | 327/434 |
| 5,753,525 A | 5/1998 | Hsu et al. | 437/43 |
| 5,759,907 A | 6/1998 | Assaderaghi et al. | 438/386 |
| 5,760,444 A | 6/1998 | Okumura | 257/350 |
| 5,786,616 A * | 7/1998 | Fukumoto et al. | 257/358 |
| 5,811,857 A * | 9/1998 | Assaderaghi et al. | 257/355 |
| 5,880,620 A * | 3/1999 | Gitlin et al. | 357/534 |
| 5,892,260 A * | 4/1999 | Okumura et al. | 257/347 |
| 5,977,593 A * | 11/1999 | Hara | 257/356 |
| 5,982,003 A | 11/1999 | Hu et al. | 257/347 |
| 5,986,867 A * | 11/1999 | Duvvury et al. | 361/111 |
| 6,015,992 A | 1/2000 | Chatterjee et al. | 257/350 |
| 6,034,397 A * | 3/2000 | Voldman | 257/355 |
| 6,074,899 A * | 6/2000 | Voldman | 438/155 |
| 6,160,292 A * | 12/2000 | Flaker et al. | 257/347 |
| 6,222,710 B1 | 4/2001 | Yamaguchi | 361/56 |
| 6,275,094 B1 | 8/2001 | Cranford, Jr. et al. | |
| 6,352,882 B1 * | 3/2002 | Assaderaghi et al. | 438/155 |
| 6,353,345 B1 * | 3/2002 | Yushan et al. | 327/112 |
| 6,369,994 B1 * | 4/2002 | Voldman | 361/56 |
| 6,424,013 B1 * | 7/2002 | Steinhoff et al. | 257/355 |

OTHER PUBLICATIONS

Jacques Gautier, et al. On the Transient Operation of Partially Depleted SOI NMOSFET's, IEEE Electron Device Letters, vol. 16, No. 11, Nov. 1995.

Dongwook Suh, et al. Physical Modeling of Beneficial Dynamic Floating-Body Effects in Non-Fully Depleted SOI CMOS Circuits, Proceedings 1994 IEEE International SOI Conference, Oct.1994.

Dongwook Suh, et al., Dynamic Floating-Body Instabilities in Partially Depleted SOI CMOS Circuits, 1994 IEEE, pp. 27.6.1-27.6.4.

J. G. Fossum, et al., Floating-Body Problems and Benefits in Fully Depleted SOI CMOS VLSI Circuits, 1991 IEEE, pp. 12.1.1-12.1.4.

Makoto Yoshimi, et al., Technology Trends of Silicon-On-Insulator—Its Advantages and Problems to be Solved—, 1994 IEEE, pp. 17.1.1-17.1.4.

Jacques Gautier, et al., Body Charge Related Transient Effects in Floating Body SOI NMOSET's. 1995 IEEE, pp. 26.1.1-26.1.4.

Dongwook Suh, et al., A Physical Charge-Based MODEL for Non-Fully Depleted SOI MOSFET's and Its Use In Assessing Floating-Body Effects In SOI CMOS Circuits, Apr. 1995 IEEE Transactions on Electron Devices, vol. 42, No. 4.

* cited by examiner

METHODS TO IMPROVE THE OPERATION OF SOI DEVICES

This application is a continuation of U.S. patent application Ser. No. 09/063,823, filed Apr. 22, 1998, which claims priority from U.S. provisional patent application Ser. No. 60/044,251 filed on Apr. 23, 1997, which is now U.S. Pat. No. 6,160,292 issued Dec. 12, 2000.

BACKGROUND OF THE INVENTION

1. Technical Field

This invention generally relates to integrated circuits. More specifically, the present invention relates to enhancing the performance of Silicon On Insulator (SOI) devices.

2. Background Art

Today, our society is heavily dependent on high-tech electronic devices for everyday activity. Integrated circuits are the components that give life to our electronic devices. Integrated circuits are found in widespread use throughout our country, in appliances, in televisions and personal computers, and even in automobiles. Additionally, manufacturing and production facilities are becoming increasingly dependant on the use of integrated circuits for operational and production efficiencies. Indeed, in many ways, our everyday life could not function as it does without integrated circuits. These integrated circuits are manufactured in huge quantities in our country and abroad. Improved integrated circuit manufacturing processes have led to drastic price reductions for these devices.

The traditional integrated circuits fabrication process is a series of steps by which a geometric pattern or set of geometric patterns is transformed into an operating integrated circuit. An integrated circuit consists of superimposed layers of conducting, insulating, and transistor-forming materials. By arranging predetermined geometric shapes in each of these layers, an integrated circuit that performs the desired function may be constructed. The overall fabrication process typically consists of the patterning of a particular sequence of successive layers using various chemicals as etchants. Many different processes exist for creating a pattern on the silicon wafer, with different processes being specifically adapted to produce the desired type of integrated circuit.

One relatively new process for fabricating integrated circuit devices is commonly known as Silicon On Insulator (SOI). SOI devices are semiconductor devices which are formed within a thin silicon layer that overlies an electrically insulating region formed over an integrated circuit substrate material. This insulating region may include, for example, a layer of $SiO_2$ deposited over a semiconductor substrate material such as silicon or gallium arsenide. This fabrication process allows devices to be created which are electrically isolated from the substrate. SOI devices offer several advantages over conventional semiconductor devices.

For example, SOI devices typically have lower parasitic capacitances which, in turn, translate into faster switching times for the resulting circuits. In addition, the well-known but undesirable phenomenon of "latchup," which is often exhibited by conventional Complementary Metal-Oxide Semiconductor (CMOS) devices, is avoided when CMOS devices are manufactured using SOI fabrication processes. SOI devices are also less susceptible to the adverse effects of ionizing radiation and, therefore, tend to be more reliable in applications where ionizing radiation may shorten the life of traditional integrated circuits.

The advantageous characteristics of SOI devices result from the dielectric isolation described above. While providing many advantages, this dielectric isolation also produces some difficulties not encountered with more conventional integrated circuit devices. In conventional devices, electrical interactions occur between the device substrate and the device active region, e.g. the current-carrying portion of the device, such as the current channel of a Metal-Oxide Semiconductor Field Effect Transistor (MOSFET). Occasionally, accumulated charge in the device active region can alter the device threshold voltage $V_T$ (i.e., the voltage at which the current channel of an enhancement-mode MOSFET begins to conduct current). However, in conventional devices, this accumulated charge is readily removed through the substrate by applying an appropriate voltage to the substrate which attracts the accumulated charge away from the active layer, into the substrate, and out through a conductive lead. For example, a negative voltage applied to the substrate attracts holes from the active layer into the substrate, while a positive voltage attracts electrons. Alternatively, it is possible to change the threshold voltage of a conventional integrated circuit device, if desired, by applying a voltage to the active region through the electrically connected substrate. This is known as the "body effect."

In contrast, in a typical SOI device, the insulating region prevents both the conduction of charge from the active region into the substrate, and the application of a voltage to the active region through the substrate. Thus, the lack of flexibility in the operation of an integrated circuit device due to the SOI insulating region is often inconvenient. For example, during operation of a typical SOI MOSFET, electrical charge can accumulate in the body of the device, (the region of the MOSFET between the source and the drain), until the concomitant electrical potential increases sufficiently to produce a shift in the threshold voltage ($V_T$) of the device. This shift can adversely affect the operation of the circuit and introduce errors into the information being processed by the device. The charge accumulates on the body of the SOI transistors in a circuit whenever the circuit is not being supplied with voltage.

For example, in a typical circuit using bulk CMOS devices, the body of an n-FET device will be connected to ground and the body of a p-FET device will be connected to the supply voltage ($V_{DD}$). Therefore, even when no voltage is applied to the n-FET or the p-FET, the body potential is controlled by the connection to either ground or $V_{DD}$ and the operational $V_T$ will be in keeping with standard design parameters for each device. In contrast, the body of an SOI device is not connected to either ground or $V_{DD}$ and, therefore, the body of the device can "float" to any voltage level. In addition, thermal fluctuations can also cause electrical charges to accumulate in the body of the transistors. Over a period of time, this charge can accumulate and can cause $V_T$ to be lower than the specified design parameters and the transistor will switch on before it should. If $V_T$ has been altered significantly, the operation of the circuit can be effected. For example, in synchronization circuits with critical timing requirements, the transistor may not switch on at the appropriate time and the circuit may not operate at all.

One specific example of the problems associated with SOI integrated devices is illustrated in FIG. 4. In FIG. 4, a typical memory circuit 400 with 256 local word line drivers comprises a highest order local word line (LWL255) circuit 430 which includes transistor 432 and node 431; a lowest order local word line circuit (LWL0) 440; a segment driver 450 which includes a pass transistor 451; and a select line 460. The illustrated circuit represents a small portion (one segment) of a much larger memory array on a typical memory chip. The lowest order local word line (LWL0) circuit 440 is driven by a low order Global Word Line (GLW0). The highest order local word line (LWL255) circuit 430 is, correspondingly, driven by a high order Global Word Line 255 (GWL255). The intervening word lines (not shown) are likewise driven by other global word lines (not shown).

The individual segments in a memory array are accessed by activating segment driver 450. When memory circuit 400 is not being accessed, all of the global word lines are deselected and are at a low voltage level and, due to the operation of the transistors connected to GWL255 shown in circuit 430, node 431 is connected to $V_{DD}$. All of the remaining word lines circuits (GWL0-GWL254) operate in the same way. When segment driver 450 is not selected, transistor 432, and the corresponding transistors in the other local word driver circuits, are not driven and are therefore turned off. Circuit 435 represents the load of the remaining word line drivers. Due to the accumulated charge stored on each of the transistors represented by this load, select line 460 appears to circuit 400 as if it were a large capacitor with a stored charge.

When segment driver 450 is activated, one of the active global word lines will provide access to a local word line for reading or writing to a specific memory location. This process is accomplished as follows. The memory chip is activated by supplying a signal to the CLOCK input of segment driver 450. The control (CTL) or segment signal is used to select one of the memory subarrays or segments for reading or writing. After a small propagation delay, the control circuit (not shown) creates a decoding signal DECODE that activates the appropriate subarray by driving select line 460 to low. When all three of the input signals to segment driver 450 are active, node 431 in the local word line driver circuit 430 is discharged through select line 460 and pull-down transistor 451 in segment driver 450.

At this point, although only one of the 256 global word lines is selected, segment driver 450 must discharge all of the accumulated charge in the body of each transistor corresponding to transistor 432 in local word line driver 430 for each of the 256 local word line drivers. This is known as "fan-out" loading. As described earlier, the bodies of the SOI transistors have a tendency to accumulate electrical charge. When a given memory segment is not being accessed for a period of time (i.e. 0.1 ms for a typical n-FET device), an electrical charge can accumulate in the body of each one of the SOI transistors. Then, when the memory segment is first accessed, the charge on each of the transistors corresponding to transistor 432 must be discharged. The "first access" is considered to be when the segment is first used to read or write data after a period of inactivity. If subsequent accesses are to the same memory segment, no charge sufficient to cause delays will have been accumulated. If, however, a different memory segment is subsequently accessed, the previously accessed memory segment may, once again, need to be discharged prior to subsequent accesses. Memory access is delayed until the electrical charge is dissipated.

The fan-out loading effect is known for a tendency to slow down memory access times associated with SOI devices, especially during the first cycle of operation, when the accumulated charge on the body of the transistors is the greatest. Also, the greater the physical distance between segment driver 450 and the selected local word line driver, the harder it is to drive. Due to the propagation delay inherent in the physical circuit wiring, body charges in more distant devices take longer to discharge through the long, relatively resistive wire. However, after the first access cycle, the SOI loading effect is diminished significantly. This is because, once the accumulated body charges in all of the N-channel FET pull-down devices have been discharged, a relatively long period of time is needed to build up the charge on the body of the transistors again. Therefore, as long as the memory access requests are to the same subarray or segment, there will be no additional access delay associated with discharge propagation delays. By logical extension, the worst access times for an SOI memory device is generally the first access cycle for a device that is located the farthest distance from segment driver 450.

The loading effect described above can be completely eliminated by connecting the body of an SOI device to a reference ground. Referring now to FIG. 7, a SOI transistor 700 formed with a body contact for connecting the body of transistor 700 to ground is shown. SOI transistor 700 has a body implant mask region 710, a source/drain implant mask region 720, a T-shaped gate 725; a source contact 730, a drain contact 740, and a body contact 750. Body contact 750 is typically connected to ground for an n-channel device and to $V_{DD}$ for a p-channel device. The creation of body contact 750 requires additional processing and mask steps when transistor 700 is being fabricated. If body contact 750 is connected to ground, the problems associated with charge build-up on the body of transistor 700 are eliminated. However, this will also negatively impact circuit operation in at least two ways. First, circuit overhead (i.e. the amount of area needed to fabricate the circuit) is significantly increased and, second, the speed advantage inherent in SOI circuits is also eliminated, because the lower variable $V_T$ of SOI devices is not longer present.

Therefore, there exists a need to provide a way to take advantage of the benefits of SOI device characteristics without suffering the possible negative implications of SOI fabricated devices. In addition, the methods employed should not unnecessarily diminish or destroy the positive advantages provided by implementing circuits and devices using SOI technology.

DISCLOSURE OF INVENTION

According to the present invention, a circuit and methods for enhancing the operation of SOI fabricated devices are disclosed. In a preferred embodiment of the present invention, a pulse discharge circuit is provided. Here, a circuit is designed to do a pulse discharge that will eliminate the accumulated electrical charge on the SOI devices in the memory subarray just prior to the first access cycle. As explained above, once the accumulated charge has been dissipated, the speed penalty for successive accesses to the memory subarray is eliminated or greatly reduced. With a proper control signal, timing and sizing, this can be a very effective method to solve the problem associated with the SOI loading effect.

Alternatively, instead of connecting the bodies of all SOI devices in a memory circuit to ground, the bodies of the speed-critical devices are selectively connected to a reference ground. This would enable the circuit to retain most of the speed advantages associated with SOI devices while overcoming the loading problem described above. With this preferred embodiment of the present invention, the major delay caused by the bipolar loading effect is minimized while the speed advantage due to providing a low Vt effect is preserved. The overall body resistance of the individual devices has a minimal effect on the device body potential.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

The present invention relates to the use and operation of integrated circuit transistors, particularly SOI transistors. For those individuals who are not familiar with CMOS and SOI fabricated devices, the Overview section below presents some basic concepts that will help to understand the invention. Those who are skilled in the art may wish to skip this section and begin with the Detailed Description Section instead.

OVERVIEW

Figure 1:
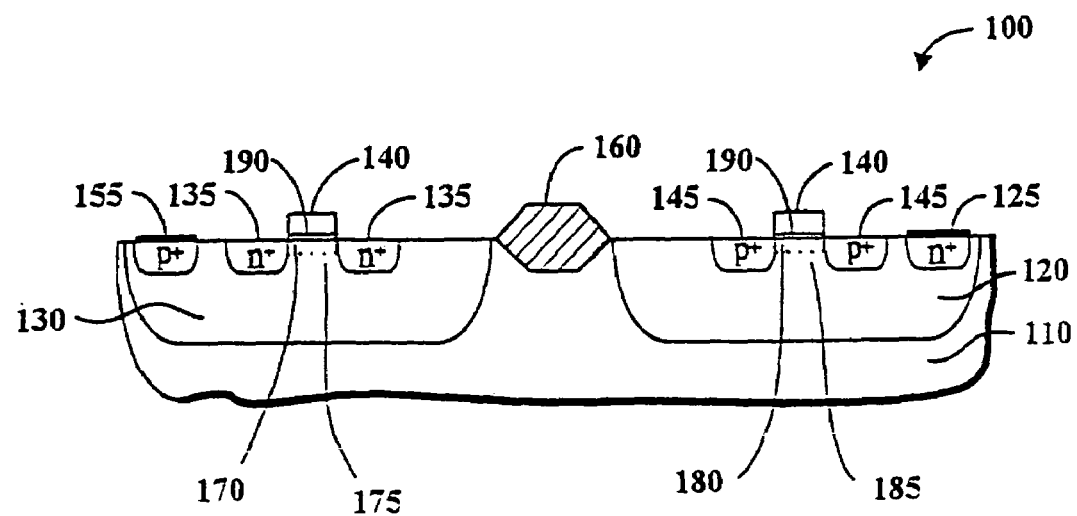
FIG. 1 is a perspective view of a portion of a bulk CMOS wafer.

Referring now to FIG. 1, a portion of a typical bulk CMOS wafer 100 includes: a substrate 110; an n-well 120; an n-well contact 125; a p-well 130; n+ source and drain diffusions 135; polysilicon gate contacts 140; p+ source and drain diffusions 145; a p-well contact 155; a surface isolation 160; an n-channel 170; an n-body 175; a p-channel 180; a p-body 185, and a gate oxide 190.

The designation of a particular device as a p-channel device or an n-channel device depends on the type of fabrication process used to create the device. Substrate 110 is any semiconductor material known to those skilled in the art. The various wells and contacts are created by using different types of constituents when the wafer is being fabricated. In normal operation, n-well contact 125 is connected to $V_{DD}$ and p-well contact 155 is connected to ground.

Figure 2:
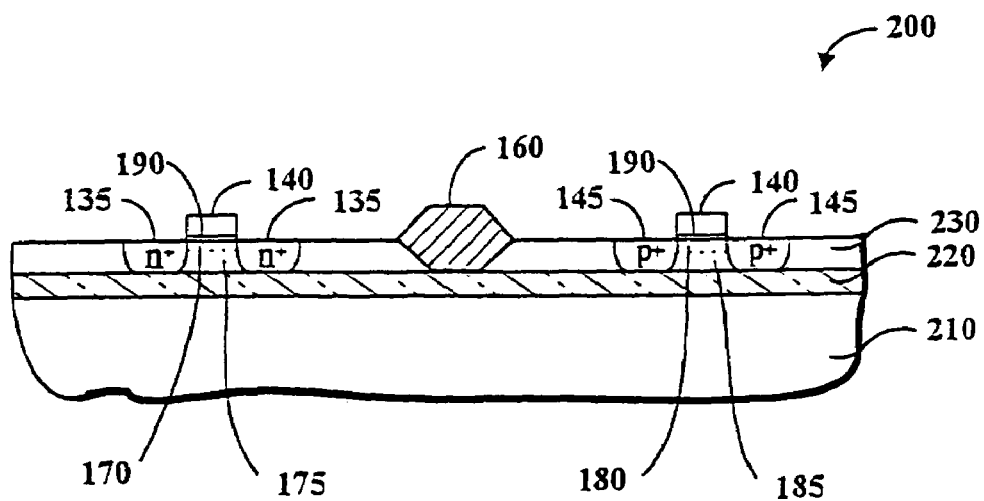
FIG. 2 is a perspective view of a portion of an SOI wafer.

Referring now to FIG. 2, a portion of a typical SOI wafer 200 includes: a substrate 210; polysilicon gate contacts 140; a buried oxide layer 220; and an active region 230. Active region 230 is a thin layer of silicon and includes n+ source and drain diffusions 135; p+ source and drain diffusions 145; a surface isolation 160; an n-channel 170; a n-body 175; a p-channel 180; a p-body 185, and gate oxide 190.

Substrate 210 is any semiconductor material, or metal, or glass, known to those skilled in the art. Source and drain diffusions 135 and 145 will typically abut buried oxide layer 220. Surface isolation 160 and buried oxide layer 220 serve to electrically isolate source and drain diffusions 135 and 145, preventing electrical charge from being transferred to and from the devices through substrate 210.

DETAILED DESCRIPTION

Figure 3:
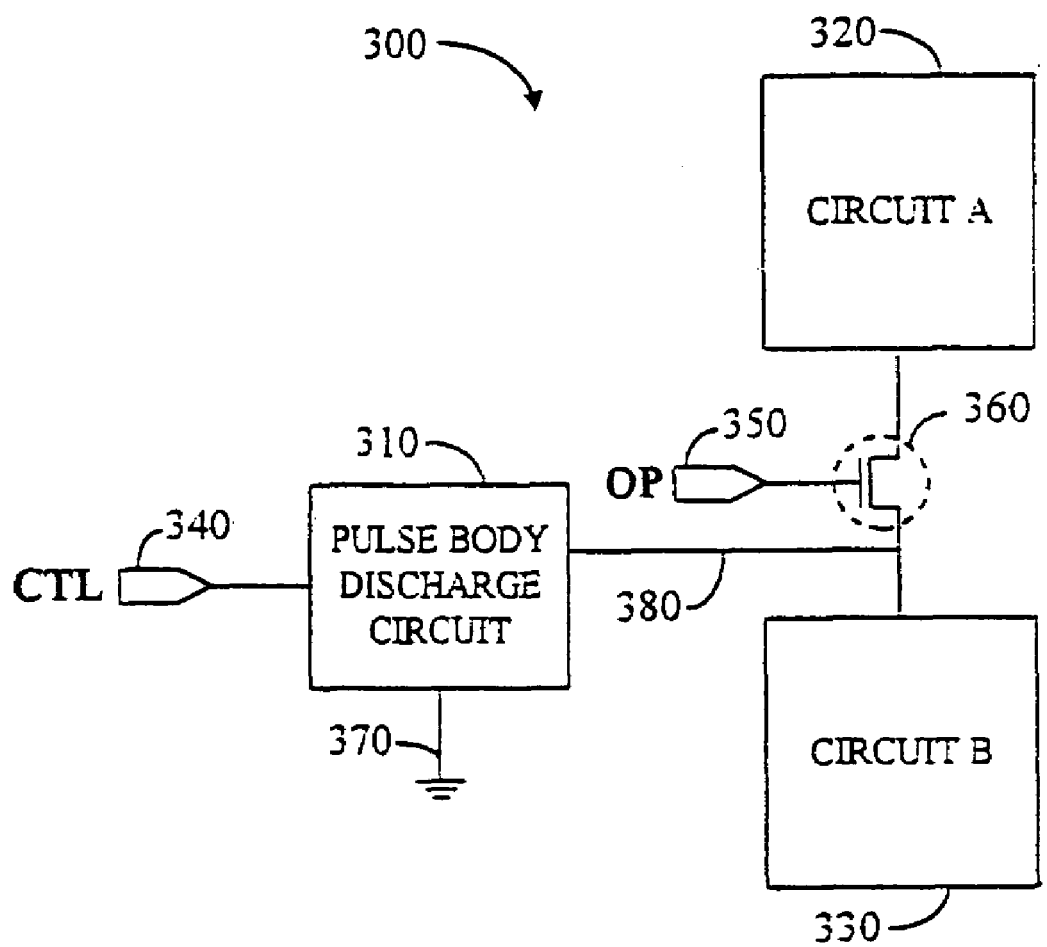
FIG. 3 is a block diagram of a circuit according to a preferred embodiment of the present invention.

Referring now to FIG. 3, a circuit 300 in accordance with a preferred embodiment of the present invention comprises: a pulse body discharge circuit 310; a circuit A 320; a circuit B 330; a control signal 340; an operation signal 350; a transistor 360; a reference ground 370; and a discharge path 380. Circuit 320 and circuit 330 may be any type of analog or digital logic device or circuit, including nand gates, memory circuits, microprocessors, and microcontroller circuits. Other examples of circuits 320 and 330 include voltage regulators, clock generation circuits, etc. In operation, transistor 360 acts as a switch for interconnecting circuits 320 and 330 whenever operation signal 350 is activated. Operation signal 350 is generated by a control circuit (not shown). Pulse body discharge circuit 310 can be used to enhance the switching speed of transistor 360. Just prior to activating operation signal 350, control signal 340 is activated. Control signal 340 is also activated by the control circuit. When control signal 340 is activated, pulse body discharge circuit 310 provides a path from transistor 360 to reference ground 370 via discharge path 380. Therefore, before transistor 360 is activated by operation signal 350, the body of transistor 360 is completely discharged.

Figure 4:
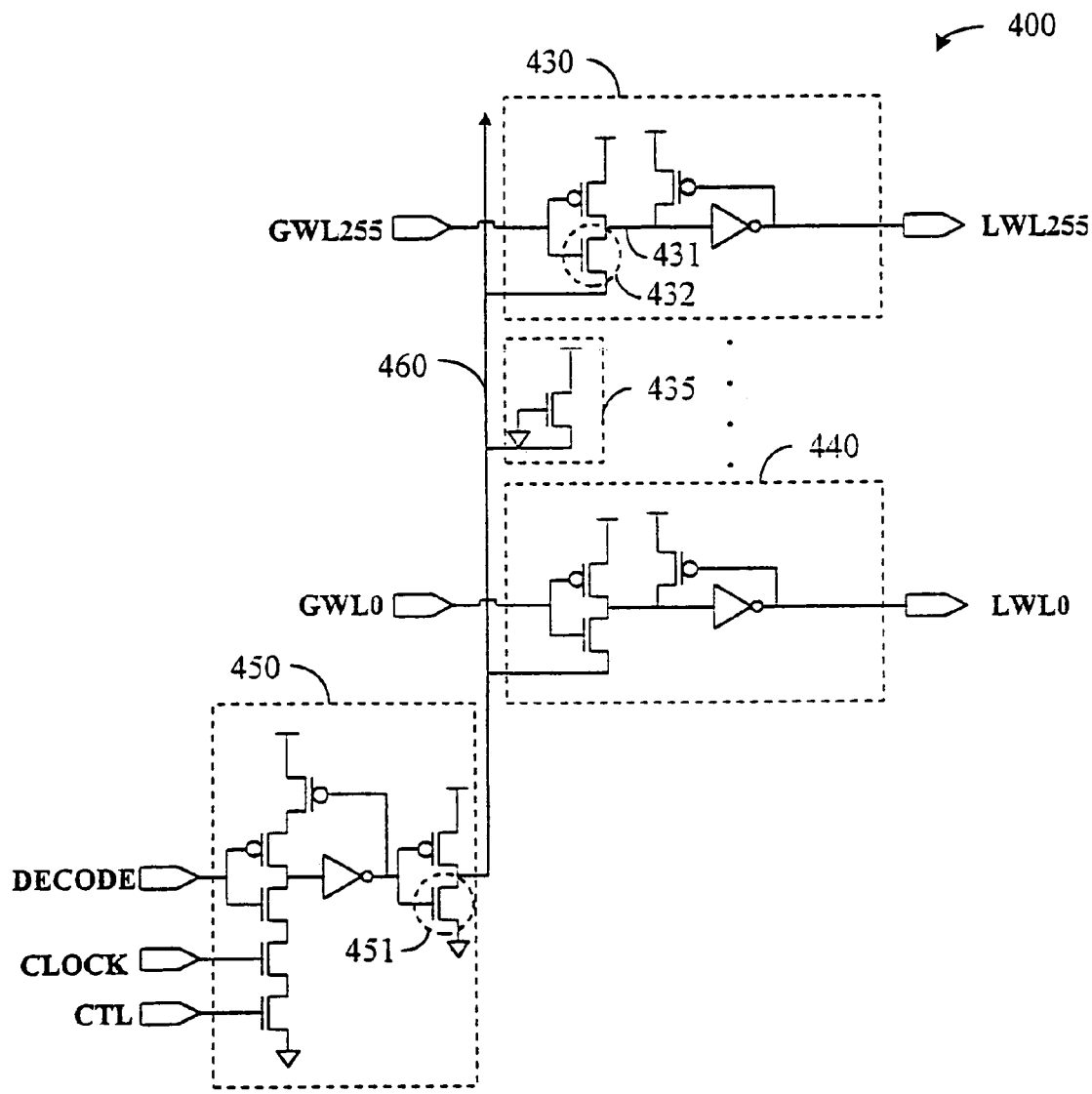
FIG. 4 is a schematic of a local word line driver array for a typical memory circuit.
Figure 5:
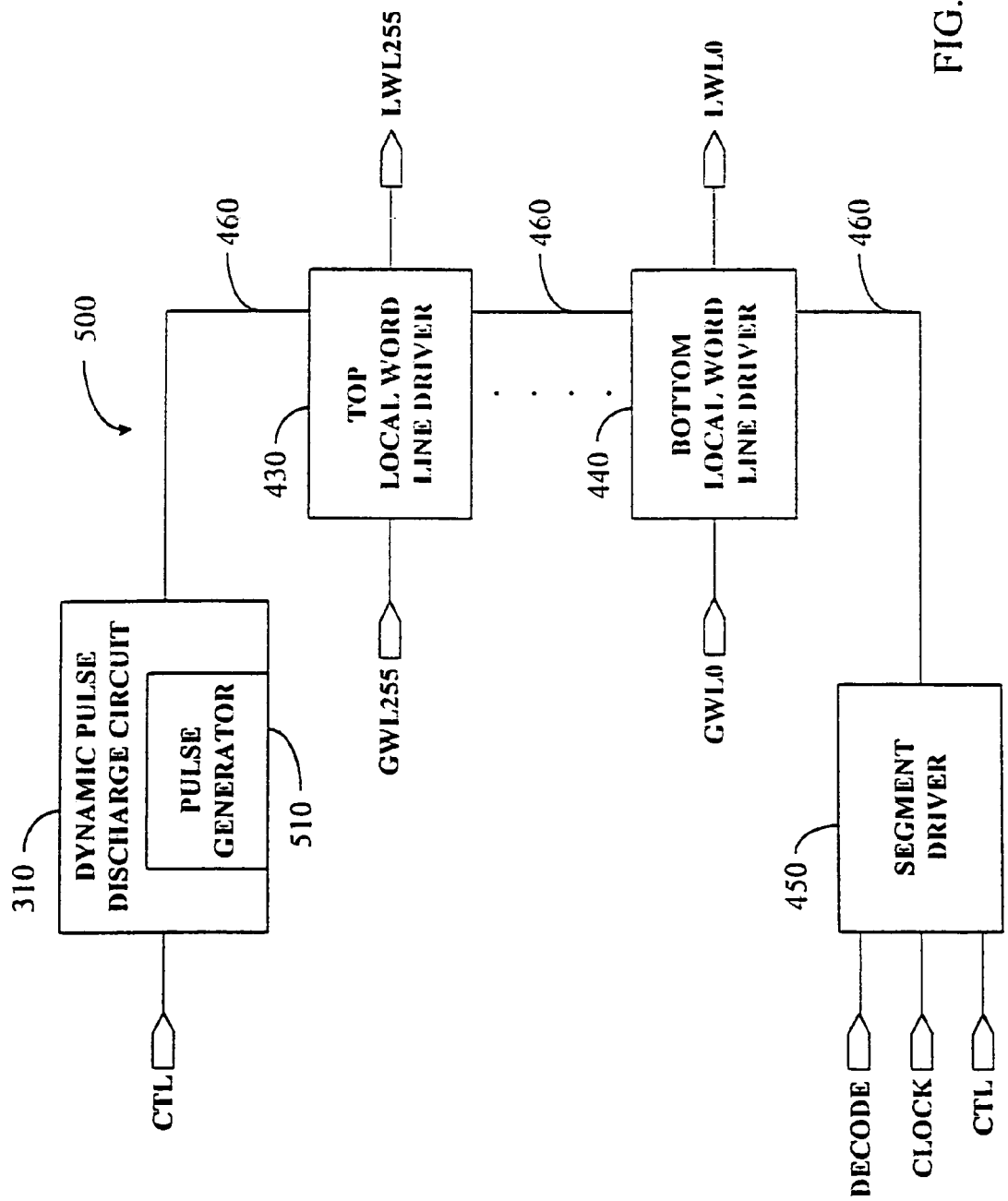
FIG. 5 is a block diagram of the circuit of FIG. 4 including a dynamic pulse discharge circuit according to a preferred embodiment of the present invention.

Referring now to FIG. 5, a memory circuit 500 in accordance with a preferred embodiment of the present invention includes: a pulse generator 510 that is a part of a dynamic pulse discharge circuit 310; local word line drivers 430 and 440; a segment driver 450; a select line 460; and the various signals explained in conjunction with FIG. 4 above. This figure illustrates how the circuit of FIG. 3 can be adapted for use in a computer memory application to provide faster switching times for memory circuit 500. Pulse generator 510 provides the discharge pulse that discharges the bodies of the SOI devices in memory circuit 500. Dynamic pulse discharge circuit 310 and pulse generator 510 are described in greater detail below.

Figure 6:
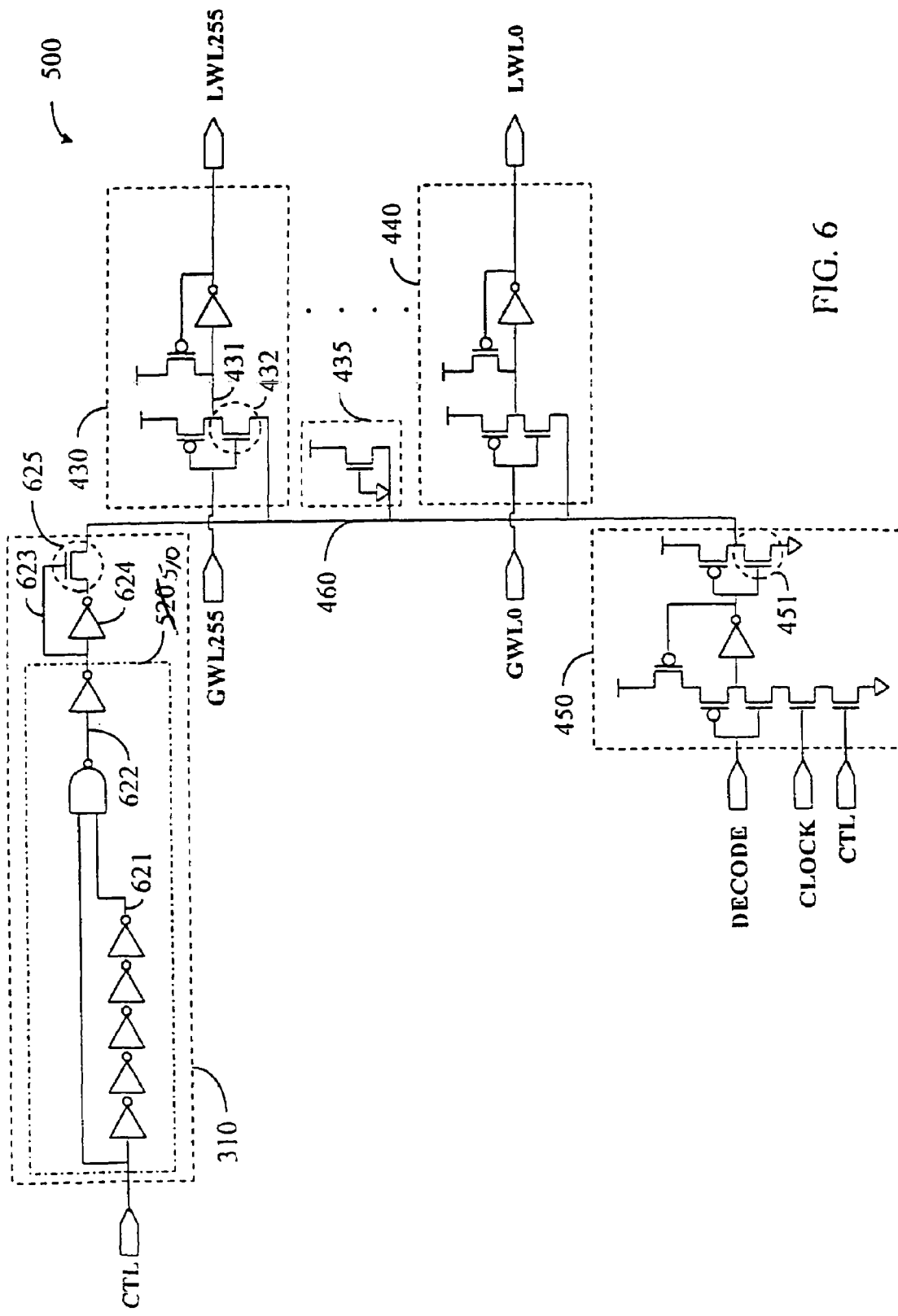
FIG. 6 is a schematic of the circuit of FIG. 5 including a dynamic pulse discharge circuit according to a preferred embodiment of the present invention.

Referring now to FIG. 6, a memory circuit 500 of FIG. 5 is shown in schematic form. The components shown in memory circuit 500 are the same as in FIG. 5. Memory circuit 500 with 256 local word line drivers includes: a highest order local word line (LWL255) circuit 430; a lowest order local word line circuit 440; a segment driver 450; and a select line 460. As before, memory circuit 500 represents a small portion (one segment) of a much larger memory array on a typical memory chip. Lowest order local word line (LWL0) circuit 440 is driven by a low order Global Word Line (GLW0). Highest order local word line (LWL255) circuit 430 is, correspondingly, driven by a high order Global Word Line 255 (GWL255). The intervening word lines (not shown) are likewise driven by other global word lines (not shown). The individual segments in a memory array are accessed by activating segment driver 450.

When segment driver 450 is activated, the active global word line will provide access to a local word line for reading or writing to a specific memory location. This process is accomplished as follows. The memory chip is activated by supplying a signal to the CLOCK input of segment driver 450. The control (CTL) or segment signal is used to select one of the memory subarrays or segments for reading or writing. In circuit 500, CTL is also supplied as an input signal to pulse discharge circuit 310. After a small propagation delay, the control circuit (not shown) creates a decoding signal DECODE that activates the appropriate subarray by connecting select line 460 to ground. When all three of the input signals to segment driver 450 are active, select line 460 is used to discharge the accumulated charge on the SOI transistors.

This time, instead of discharging through segment driver 450 as shown in FIG. 4, the accumulated charge is dissipated through a pull-down transistor in inverter 624 which is located in pulse discharge circuit 310. This is accomplished as follows. In normal operation, to select a given memory subarray, the CTL signal for that subarray transitions for low to high. This CTL signal is also supplied to pulse discharge circuit 310 as an input signal. After a brief propagation delay through a delay element (invertors or other circuit device), circuit node 621 will transition from high to low. Circuit node 622 will generate a negative pulse and, after passing through an inverter, becomes a positive pulse at node 623. The positive signal or pulse applied to transistor 625 activates transistor 625 which, in turn, provides a path for discharging the word line drivers of memory circuit 500 through inverter 624. The pulse discharge signal generated by pulse generator 510 is the output signal from the pulse discharge circuit and, in a preferred embodiment of the present invention, is supplied to the memory subarray just prior to the selection of the subarray for access. This means that the charge accumulated on the bodies of the SOI transistors has already been discharged when the request to access the subarray is received. By removing the charge before the first access occurs, the access time to the subarray is greatly enhanced. While it is possible to provide a discharge pulse prior to every access, this is not necessary. Once the initial accumulation of charge has been dissipated, as long as subsequent accesses are to the same subarray, there will not be very much charge accumulated in the subarray. By discharging the subarray prior to the first access only, the additional power requirements necessary to implement the invention are minimal.

Figure 7:
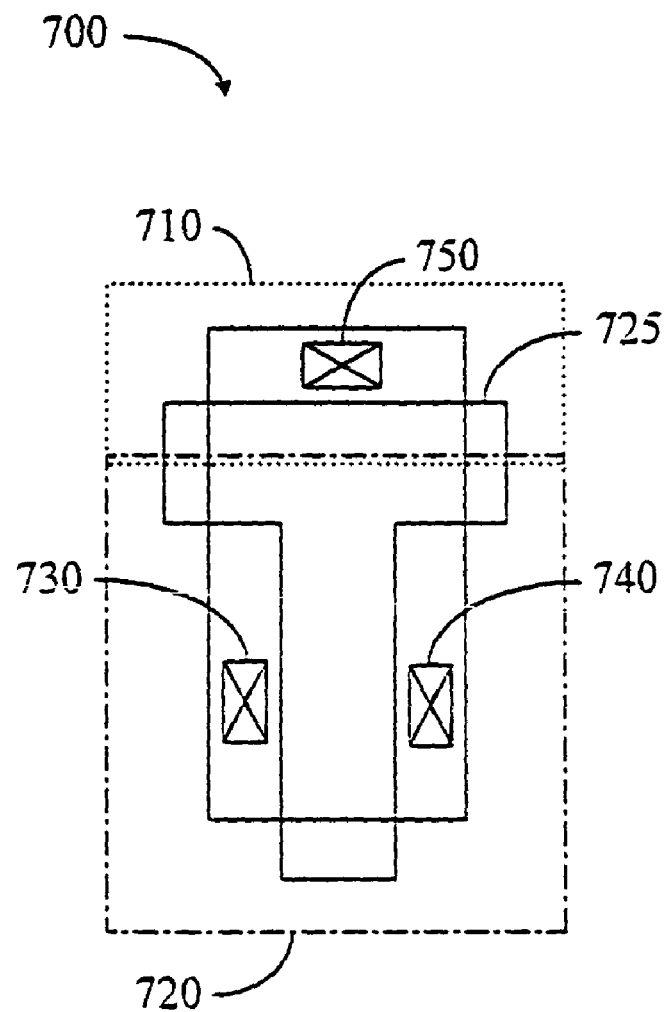
FIG. 7 is a plan view of an SOI transistor fabricated with a body contact.

Another preferred embodiment of the present invention utilizes selective connection of the body of SOI devices to reference ground which, as discussed above in reference to FIG. 7, will require some additional space on a typical chip. To use this method, the specific devices in a given circuit which are most critical to circuit access and performance time are identified and the bodies of those devices are connected to ground or $V_{DD}$. All other SOI devices in the circuit remain floating. For example, in FIG. 4, the body of transistor 432, and all other corresponding transistors in the other word line driver circuits, would be connected to ground. This method will successfully overcome most of the delays associated with the loading effect for circuit 400 during the first access cycle. However, because of the R/C delays described above, access to the top-most line driver in a memory circuit will still be much slower than for those line drivers located closest to the segment driver.

In summary, using a pulse body node discharge circuit can improve the access/switching time of SOI memory devices significantly. If the discharge pulse is only applied when first accessing a new subarray or segment, the extra power consumed will be negligible. In addition, the extra circuitry required to generate the pulse is negligible and can be added to a typical circuit layout without adversely impacting the overall chip size. If, on the other hand, the discharge pulse is applied to every memory access cycle, the access speed of the SOI memory device can be optimized. This implementation will cause some additional power consumption but remains desirable for those applications where high-speed memory access is necessary.

While the invention has been particularly shown and described with reference to preferred embodiments thereof, it will be understood by those skilled in the art that various changes in form and details may be made therein without departing from the spirit and scope of the invention.

The invention claimed is:

1. A method for discharging accumulated charge from a body of an SOI device and accessing the SOI device, comprising:

generating a pulse;

using the generated pulse to provide a conductive path from the body of the SOI device to a reference point having a lower potential than the accumulated charge;

discharging the accumulated charge from the body of the SOI device to the reference point;

providing a control signal which enables access to the SOI device; and reading an output of the SOI device, wherein said steps of generating a pulse and discharging the accumulated charge occur prior to said step of reading an output of the SOI device.

2. In a circuit comprising a plurality of SOI devices, wherein said plurality of SOI devices comprises a memory circuit and wherein each of the plurality of SOI devices has a body, a method for enhancing the performance of the circuit, the method comprising:

providing a pulse discharge circuit, the pulse discharge circuit having a pulse generator connected to the circuit;

using the pulse generator to generate a pulse; and discharging any accumulated potential on the body of at least one of the plurality of SOI devices to a point having a lower potential than the accumulated potential of the body in response to the pulse from the pulse generator just prior to accessing the memory circuit for reading or writing data.

\* \* \* \* \*